(12) United States Patent
Murakami (10) Patent No.: US 7,741,616 B2
(45) Date of Patent: Jun. 22, 2010

(54) EUV LIGHT SOURCE, EUV EXPOSURE EQUIPMENT, AND SEMICONDUCTOR DEVICE MANUFACTURING METHOD

(75) Inventor: Katsuhiko Murakami, Sagamihara (JP)

(73) Assignee: Nikon Corporation (JP)

( * ) Notice: Subject to any disclaimer, the term of this patent is extended or adjusted under 35 U.S.C. 154(b) by 435 days.

(21) Appl. No.: 11/629,535

(22) PCT Filed: Jun. 22, 2005

(86) PCT No.: PCT/JP2005/011865

§ 371 (c)(1),
(2), (4) Date: Dec. 14, 2006

(87) PCT Pub. No.: WO2006/001459

PCT Pub. Date: Jan. 5, 2006

(65) Prior Publication Data

US 2008/0068575 A1 Mar. 20, 2008

(30) Foreign Application Priority Data

Jun. 24, 2004 (JP) .............................. 2004-186133

(51) Int. Cl.
*H01J 27/00* (2006.01)
(52) U.S. Cl. ...................... 250/426; 250/424; 250/425; 250/492.1; 250/492.2; 250/493.1; 250/494.1; 250/504 R
(58) Field of Classification Search ............... 250/492.1, 250/492.2, 493.1, 494.4, 424, 425, 426, 504 R
See application file for complete search history.

(56) References Cited

U.S. PATENT DOCUMENTS 6,324,255 B1 11/2001 Kondo et al.

(Continued)

FOREIGN PATENT DOCUMENTS

JP 2001-023795 A 1/2001

(Continued)

OTHER PUBLICATIONS

Japanese Search Report dated Nov. 9, 2005 for International Application No. PCT/JP2005/012007.

(Continued)

*Primary Examiner*—Jack I Berman
*Assistant Examiner*—Hanway Chang
(74) *Attorney, Agent, or Firm*—Finnegan, Henderson, Farabow, Garrett & Dunner, LLP (57) ABSTRACT

A liquid in which fine solid Sn particles are dispersed in a resin is accommodated inside the heated tank 4. The resin pressurized by a pressurizing pump is conducted to a nozzle 1, so that a liquid-form resin is caused to jet from the tip end of the nozzle 1 that is disposed inside a vacuum chamber 7. The liquid-form resin which is caused to jet from the nozzle 1 assumes a spherical shape as a result of surface tension, and is solidified by being cooled in a vacuum, so that a solid-form target 2 is formed. A laser introduction window 10 used for the introduction of laser light is formed in the vacuum chamber 7, and laser light generated from a laser light source 8 disposed on the outside of the vacuum chamber 7 is focused by a lens 9 and conducted into the vacuum chamber 7, so that the target is converted into a plasma, thus generating EUV light.

11 Claims, 6 Drawing Sheets

U.S. PATENT DOCUMENTS

| | | |
|---|---|---|
| 6,507,641 B1 | 1/2003 | Kondo et al. |
| 6,560,313 B1 | 5/2003 | Harding et al. |
| 2002/0041368 A1* | 4/2002 | Ota et al. ..................... 355/55 |
| 2002/0070353 A1 | 6/2002 | Richardson |
| 2002/0094063 A1 | 7/2002 | Nishimura et al. |
| 2002/0141536 A1* | 10/2002 | Richardson ................ 378/119 |
| 2003/0080302 A1 | 5/2003 | Yashiro |
| 2003/0194055 A1 | 10/2003 | Mochizuki |
| 2004/0108473 A1* | 6/2004 | Melnychuk et al. ..... 250/504 R |
| 2004/0208286 A1 | 10/2004 | Richardson |
| 2005/0167617 A1 | 8/2005 | Derra et al. |

FOREIGN PATENT DOCUMENTS

| | | |
|---|---|---|
| JP | 2001-155670 A | 6/2001 |
| JP | 2003-008124 A | 1/2003 |
| JP | 2003-133100 A | 5/2003 |
| JP | 2003-303696 A | 10/2003 |
| JP | 2004-288517 A | 10/2004 |
| WO | WO 00/19496 A1 | 4/2000 |
| WO | WO 01/31678 A1 | 5/2001 |
| WO | WO 02/46839 | 6/2002 |
| WO | WO 02/46839 A2 | 6/2002 |
| WO | WO 03/094581 A1 | 11/2003 |
| WO | WO 2004/062050 | 7/2004 |
| WO | WO 2004062050 A2 * | 7/2004 |

OTHER PUBLICATIONS

Japanese Search Report dated Sep. 28, 2005 for International Application No. PCT/JP2005/011865.

* cited by examiner

EUV LIGHT SOURCE, EUV EXPOSURE EQUIPMENT, AND SEMICONDUCTOR DEVICE MANUFACTURING METHOD

TECHNICAL FIELD

The present invention relates to an EUV light source which generates EUV light ((extreme ultraviolet light); in the present specification and patent claims, this refers to light having a wavelength of 100 nm or shorter), as well as an EUV exposure apparatus using this EUV light source, and a semiconductor device manufacturing method using this EUV exposure apparatus.

BACKGROUND ART

As the degree of integration of semiconductor integrated circuits has increased, circuit patterns have become finer, and the resolution has become insufficient in the case of conventionally used exposure apparatuses utilizing visible light or ultraviolet light. As is universally known, the resolution of an exposure apparatus is proportional to the numerical aperture (NA) of the transfer optical system, and is inversely proportional to the wavelength of the light that is used for exposure. Accordingly, as one means of increasing the resolution, there have been attempts to use a short-wavelength EUV light source (also called a "soft X-ray" light source) for exposure and transfer instead of visible light or ultraviolet light.

Light sources that are considered to be especially promising as EUV light generating devices used in such exposure and transfer apparatuses are laser plasma EUV light sources (these may be referred to below as "LPP (laser produced plasma)") and discharge plasma EUV light sources.

In LPP, pulsed laser light is focused on a target material inside a vacuum vessel so that this target material is converted into a plasma, and the EUV light that is radiated from this plasma is utilized. Such devices have a brightness comparable to that of an undulator, while at the same time being compact.

Furthermore, EUV light sources using a discharge plasma such as dense plasma focus (DPF) are compact, produce a large amount of EUV light, and are inexpensive. In recent years, these light sources have attracted attention as light sources for EUV exposure apparatuses using EUV light with a wavelength of 13.5 nm.

Figure 6:
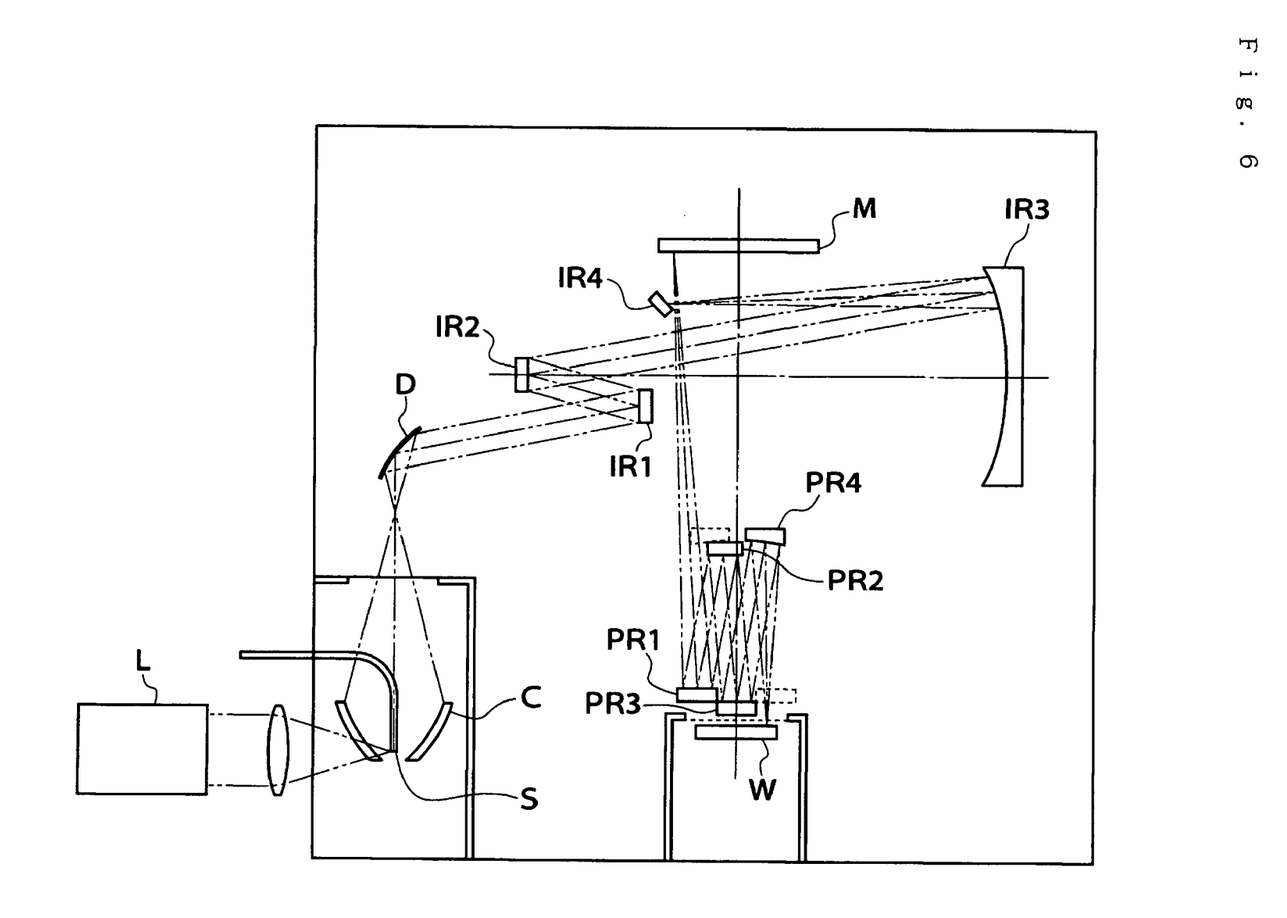
FIG. 6 is a diagram showing an outline of an EUV exposure apparatus.

An outline of such an EUV exposure apparatus is shown in FIG. 6. In this figure, IR1 through IR4 are reflective mirrors of an illumination optical system, and PR1 through PR4 are reflective mirrors of a projection optical system. W is a wafer, and M is a mask.

Laser light emitted from a laser light source L is focused on a target S, and X-rays are generated from the target S by the plasma phenomenon. These X-rays are reflected by reflective mirrors C and D, and are incident on the illumination optical system as parallel X-rays. Then, the X-rays are successively reflected by the reflective mirrors IR1 through IR4 of the illumination optical system, and illuminate an illuminated region on the mask M. The X-rays reflected by the pattern formed on the mask M are successively reflected by the reflective mirrors PR1 through PR4 of the projection optical system, so that an image of the pattern is focused on the surface of the wafer W.

As EUV light sources with a wavelength of 13.5 nm that is thus used in EUV exposure apparatuses (both laser plasma light sources and discharge plasma light sources), EUV light source utilizing an Xe plasma using Xe gas or liquefied Xe as target substance have been widely researched and developed. The reasons for this are that a relatively high conversion efficiency (ratio of EUV light intensity obtained to input energy) is obtained, and that the problem of debris (scattered particles) tends not to occur since Xe is a gaseous material at ordinary temperatures.

However, in the case of techniques using Xe gas as a target, there are limits to how far a higher output EUV light source can be obtained, so that there is a demand for the use of other substances. In particular, it is known that Sn is effective in obtaining a high conversion efficiency.

However, if Sn is used "as is" as a solid target, the density of the plasma that is generated also becomes too high, so that the exciting laser is absorbed by the generated plasma, or so that the EUV light itself that is generated from the plasma is also absorbed. Accordingly, there is a problem in that the EUV light conversion efficiency cannot be increased as might be thought.

Furthermore, since Sn is a low melting point metal, the following problems are encountered:

(1) In the case of a laser plasma light source, a large amount of debris is generated when the solid Sn target is irradiated with the laser. If the Sn is supplied after being heated and converted into a vapor in order to avoid this problem, the density is reduced, so that a sufficiently high conversion efficiency cannot be obtained. Furthermore, solidification occurs in the low-temperature peripheral areas, so that there is a large amount of adhesion in these areas.

(2) In the case of a discharge plasma light source, it is difficult to supply a material in a solid state to the discharge space (the space where the plasma is generated between the electrodes). If the material is supplied after being heated and vaporized, the material solidifies in the peripheral low-temperature areas, so that large amounts of material adhere in these areas.

Accordingly, although it is known that Sn is a high-efficiency material, it has been difficult to use Sn "as is" as a target substance in EUV light sources.

DISCLOSURE OF THE INVENTION

The present invention was devised in light of such circumstances; it is a first object of the present invention to provide an EUV light source in which the increase in plasma density caused by the use of a solid target such as Sn is suppressed, so that a high EUV light conversion efficiency can be obtained, an EUV exposure apparatus using this EUV light source, and a semiconductor device manufacturing method using this EUV exposure apparatus. Furthermore, it is a second object of the present invention to provide an EUV light source which makes it possible to reduce debris, an EUV exposure apparatus using this EUV light source, and a semiconductor device manufacturing method using this EUV exposure apparatus.

The first means used to achieve the object described above is a plasma EUV light source in which plasma is produced from a target, and EUV light generated from this plasma is emitted, wherein the target comprises fine particles of a solid target dispersed in a medium.

In this means, the solid target such as Sn that is converted into a plasma by irradiation with an exciting laser or by means of a discharge is dispersed in a medium in the form of fine particles. Accordingly, the density of the plasma that is produced can be prevented from becoming too high. Furthermore, since the target is disposed after being dispersed in a medium, the target material that becomes debris instead of being converted into a plasma can be reduced, so that the amount of debris can be reduced.

In this case, if a target material containing Sn is used as the fine target particles, EUV light having a peak in the vicinity of 13.4 nm can be generated, so that EUV light with a higher intensity can be used in an apparatus using light with a wavelength in this vicinity.

Furthermore, it is desirable that the medium be a liquid. Moreover, it is desirable that the medium be a liquid formed by heating and melting a plastic resin, and it is also desirable that this plastic resin be a thermoplastic resin. In addition, it is desirable that a nozzle for causing the jetting of these liquid media be provided. When the heated and melted liquid-form plastic resin is caused to jet from the nozzle, the plastic resin assumes the form of particles as a result of surface tension, and may in some cases be cooled to form solid particles. Fine solid particles are dispersed and contained among these liquid or solid plastic resin particles.

Accordingly, as a result of these fine solid particles being irradiated with laser light so that these fine solid particles are converted into a plasma, EUV light is emitted. If the plastic resin particles are solidified into a substantially spherical shape after being caused to jet from the nozzle, the shape is stabilized compared to that of liquid droplets. Accordingly, the direction in which the particles fly is stabilized, so that the target can be stably supplied to the location where the plasma is generated. Consequently, the output and the like of the light source can be made more stable. Furthermore, the method that is used to convert the target into a plasma may employ various universally known means. For example, the present means can also be applied to the discharge plasma EUV light source described above. It is desirable that the liquid be solidified after being caused to jet from the nozzle.

The target is a liquid until this target is caused to jet from the nozzle, but the target is subsequently solidified. Accordingly, the shape is stabilized compared to that of a target that is caused to fly in a liquid state. Consequently, the target can be stably supplied to the location where the plasma is generated, so that the output and the like of the light source can be made more stable. Furthermore, since the fine solid particles are solid, the density is higher than that of Xe gas; as a result, a high conversion efficiency can be achieved. If a thermoplastic resin is used, this resin can easily be liquefied by heating; accordingly, this is suitable for use as the substance in which the fine solid particles are dispersed.

The second means used to achieve the object described above is an EUV exposure apparatus in which a mask is irradiated with EUV light from an EUV light source via an illumination optical system, and a pattern formed on the mask is exposed and transferred to a reactive substrate such as a wafer by a projection optical system, wherein the EUV light source is the EUV light source of the first means.

In this means, since a plasma EUV light source having a high conversion efficiency is used, an EUV light source which has a large quantity of light can be realized, so that the throughput can be increased.

The third means that is used to achieve the object described above is a semiconductor device manufacturing method having a process in which a pattern formed on a mask is exposed and transferred to a reactive substrate such as a wafer using the EUV exposure apparatus constituting the second means.

In this means, since an exposure apparatus with a good throughput is used, the production efficiency of semiconductor devices can be increased.

BEST MODE FOR CARRYING OUT THE INVENTION

Figure 1:
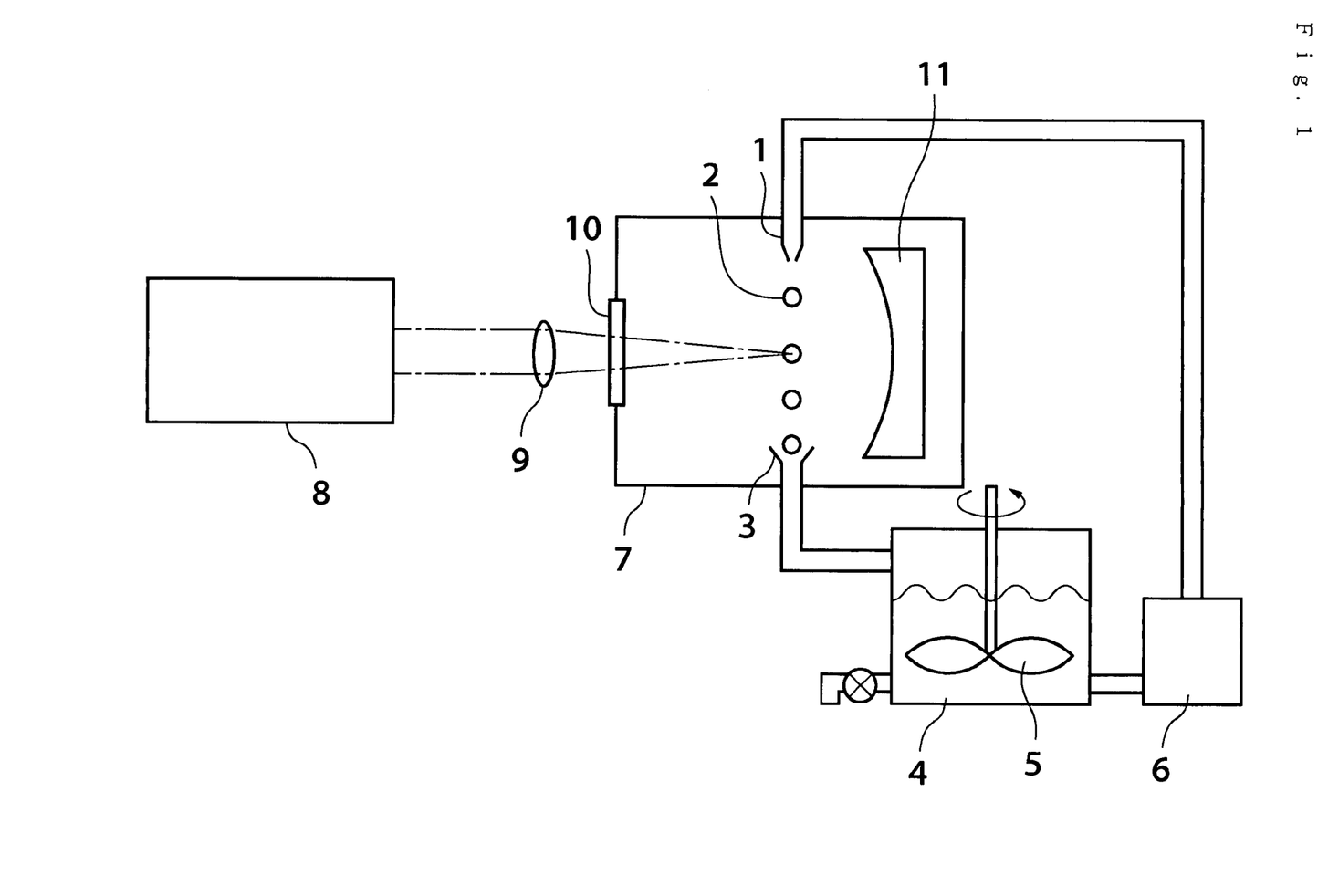
FIG. 1 is a diagram showing an outline of a laser plasma EUV light source constituting a first working configuration of the present invention.

Working configurations of the present invention will be described below using the figures. FIG. 1 is a diagram showing an outline of a laser plasma EUV light source constituting a first working configuration of the present invention.

A liquid in which fine solid Sn particles are dispersed in a polystyrene resin is accommodated inside a heated tank 4. For example, the concentration of the fine solid Sn particles is 1 to 10 wt %. Furthermore, for example, the diameter of the fine solid Sn particles is 50 to 200 nm. A solution agitation mechanism 5 is provided in order to prevent the fine solid Sn particles from settling. In this example, the solution agitation mechanism 5 is a mechanism that causes vanes to rotate in the liquid.

The tank 4 is connected to a pressurizing pump 6 by piping, and the resin pressurized by this pressurizing pump is conducted to a nozzle 1, so that a liquid-form resin is caused to jet from the tip end of this nozzle 1 disposed inside a vacuum chamber 7. The piping extending from the tank 4 to the nozzle 1 via the pressurizing pump 6 is all heated so that the resin does not solidify en route.

The liquid-form resin that is caused to jet from the nozzle 1 assumes a spherical shape as a result of surface tension, and is solidified by being cooled in a vacuum, so that a solid-form target 2 is formed. The temperature, viscosity and pressurizing pressure of the melted resin, the diameter of the nozzle 1, and the like are set so that a target 2 of fixed dimensions is supplied at fixed time intervals from the nozzle 1. As a result of these adjustments, the diameter of the target 2 is set at approximately 50 to 200 m. It is desirable that the target 2 be set so that this target agrees with the amount of target that is converted into plasma and consumed by exactly one pulse of laser irradiation. If the target is too large, the remaining portion of the target that is not converted into plasma will be the cause of debris; accordingly, such an excessively large size is undesirable. Conversely, if the target is too small, the conversion efficiency drops; accordingly, such a small size is likewise undesirable A laser introduction window 10 used for the introduction of laser light is formed in the vacuum chamber 7, and laser light generated by an Nd:YAG laser light source 8 disposed on the outside of the vacuum chamber 7 is focused by a lens 9 and introduced into the vacuum chamber 7.

The respective parts are disposed so that the target 2 passes through the focal position of the laser, and the target supply and laser pulses are synchronously controlled so that laser pulses are emitted precisely when the target 2 arrives at the focal position. Specifically, the position of the target 2 is monitored by a monitoring mechanism (not shown in the figure), and a light emission trigger is applied to the Nd:YAG laser light source 8 when the target 2 arrives at the focal position of the laser.

The target 2 that is irradiated by the laser is converted into a plasma, and radiates light that includes EUV light. A focusing mirror 11 focuses the EUV light that is generated from the plasma, and conducts this light to the illumination optical system (not shown in the figure). The focusing mirror 11 has a reflective surface which has the shape of an ellipsoid of revolution, and the reflective surface of this mirror is coated with a multilayer Mo/Si film. Furthermore, one focal position of the ellipsoid of revolution is the focal position of the laser, i.e., the position where EUV light is generated. Accordingly, the light that is reflected by the focusing mirror 11 is focused at the other focal position, and is then conducted into the illumination optical system.

The residue of the target 2 that remains without being converted into a plasma is recovered by a target recovery mechanism 3. The recovered target residue is returned to the tank 4, and is reutilized after being again heated and melted. A backflow prevention mechanism (not shown in the figure) is disposed between the target recovery mechanism 3 and the tank 4, so that the backflow of vapor inside the tank into the vacuum chamber 7 is prevented.

Figure 2:
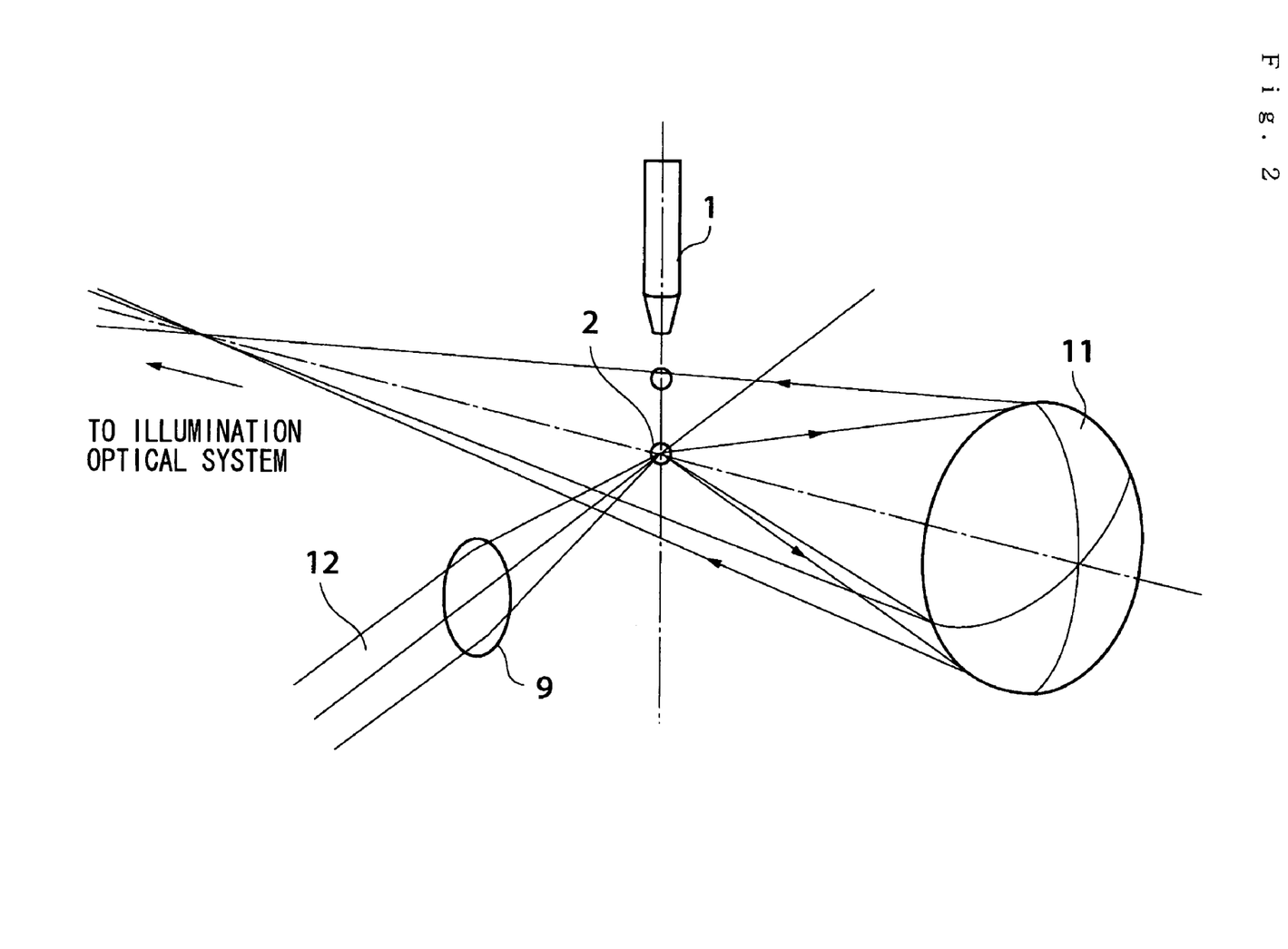
FIG. 2 is a diagram showing the relationship of the respective dispositions of the nozzle that supplies the target, the laser light and the focusing mirror in the working configuration of the present invention shown in FIG. 1.

In FIG. 1, it appears that the EUV light that is reflected by the focusing mirror 11 interferes with the laser introduction window 10 and the like. In actuality, however, as is shown in FIG. 2, the parts are disposed so that the central axis of the nozzle 1 that supplies the target 2, the central axis of the laser light 12, and the axis of the principal rays of the EUV light that is reflected by the focusing mirror 11 are perpendicular to each other. Accordingly, there is no interference of the EUV light with the laser introduction window 10 or the like.

Figure 3:
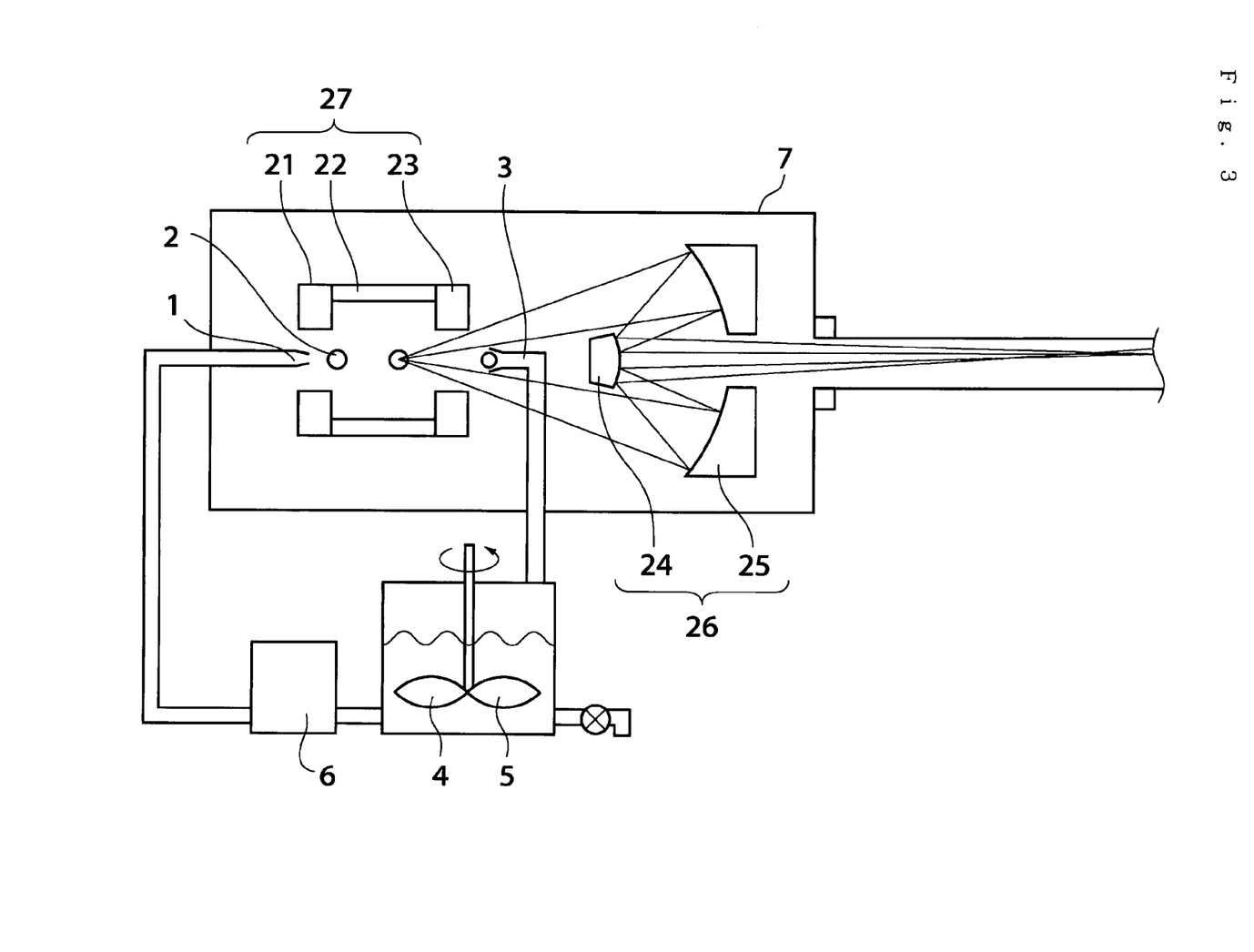
FIG. 3 is a diagram showing an outline of a discharge plasma EUV light source constituting a second working configuration of the present invention.

FIG. 3 is a diagram showing an outline of a discharge plasma EUV light source constituting a second working configuration of the present invention. Furthermore, constructions that are the same as in the working configuration shown in FIG. 1, which is the first example, are labeled with the same symbols, and an explanation of these constructions is omitted. In this working configuration as well, for the same reasons as those described above, it is desirable that the target 2 be set so as to coincide precisely with the amount of target that is consumed by being converted into a plasma in a single discharge.

The target 2 that is caused to jet from the nozzle 1 is conducted into the discharge space of a Z-pinch type discharge plasma light source 27. This Z-pinch type discharge plasma light source 27 is constructed from a circular disk-form electrode (anode) 21 that has a hole formed therein, an electrode (cathode) 23 that has a similar shape, and a tubular insulator 22 that connects both of these electrodes. When a high-voltage pulse is applied across the electrode (anode) 21 and electrode (cathode) 23, the substance present in the space between these electrodes is converted into a plasma by the resulting discharge, so that light including EUV light is radiated.

The respective parts are disposed so that the target 2 passes through the discharge space, and the target supply and high-voltage pulses are synchronously controlled so that a high-voltage pulse is applied precisely when the target 2 arrives at the central position of the discharge space.

An oscillating mechanism (not shown in the figures) is disposed on the nozzle 1, so that the timing of the jetting of the liquid can be controlled by applying an oscillation to the liquid jetting direction of the nozzle 1. The oscillation applied to the nozzle 1 and the trigger applied to the high-voltage power supply are controlled so that the synchronization described above is obtained.

The focusing optical system 26 focuses the EUV light that is generated from the plasma, and conducts this light to the illumination optical system (not shown in the figures). The focusing optical system 26 is a Schwarzschild optical system that is constructed from two concentric spherical reflective surfaces 24 and 25; these reflective surfaces are coated with a multilayer Mo/Si film.

The residue of the target 2 that remains without being converted into a plasma is recovered by a target recovery mechanism 3. The recovered target residue is returned to the tank 4, and is reutilized after again being heated and melted. A backflow prevention mechanism (not shown in the figures) is disposed between the target recovery mechanism 3 and tank 4, so that the backflow of vapor from the inside of the tank into the vacuum chamber 7 is prevented.

Figure 4:
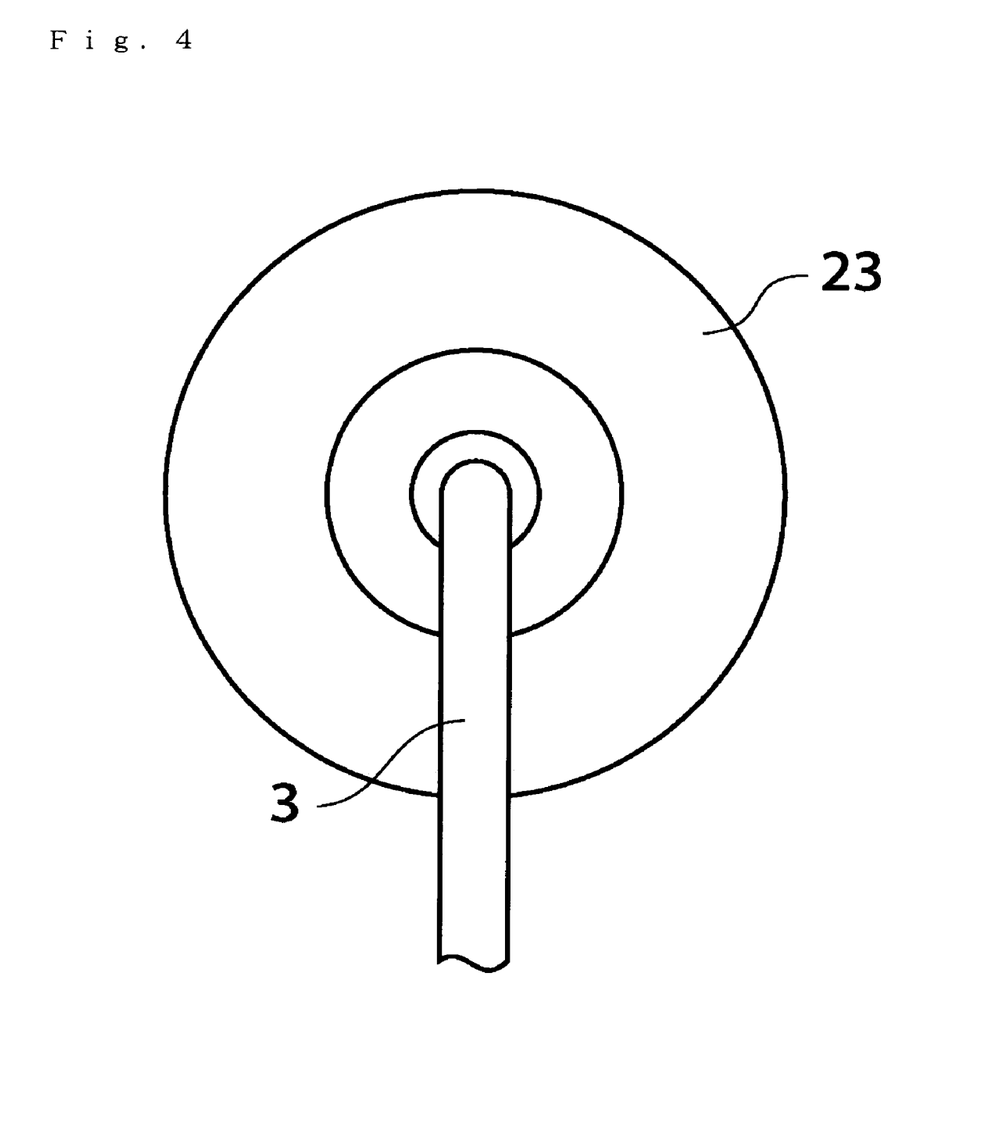
FIG. 4 is a diagram showing the positional relationship of the target recovery mechanism and the discharge plasma light source in the working configuration of the present invention shown in FIG. 3.

The positional relationship of the target recovery mechanism 3 and discharge plasma light source 27 is as shown in FIG. 4; these parts are disposed so that the central axis of the hole in the electrode 23 and the central axis of the opening part in the target recovery mechanism 3 substantially coincide with each other.

The target recovery mechanism 3 blocks a portion of the EUV light that is generated by the discharge plasma light source 27. Since the Schwarzschild optical system used in the focusing optical system 26 is an optical system with central blocking, light rays in the vicinity of the optical axis cannot be focused to begin with. In the present working configuration, the target recovery mechanism 3 is disposed as far as possible within the centrally blocked region of the Schwarzschild optical system, so that the loss of EUV light caused by such blockage is minimized.

Besides a Schwarzschild optical system, a Wolter type optical system can also be used as the focusing optical system 26; in this case as well, the optical system is an optical system with central blocking. Accordingly, the loss of EUV light due to blockage can be minimized by a similar disposition.

In the first and second working configurations described above, a polystyrene resin was used as the resin; however, the plastic resin used is not limited to this. Besides polystyrenes, for example, other thermoplastic resins such as vinyl chloride resins, ABS resins, methacrylic resins, polyethylene resins, polypropylene resins, polyamide resins, polyacetal resins, and polycarbonate resins may also be used.

Furthermore, Sn was used as the fine solid particle material; however, other solid materials may also be used. In cases where the temperature required in order to heat and liquefy the resin ends up being higher than the melting point of Sn, tin oxide ($SnO_2$ or the like) may be used instead of Sn. In cases where it is desired to generate EUV light or X-rays having a wavelength other than a wavelength in the vicinity of 13.5 nm, a solid material other than Sn, which is suited to this wavelength, may be appropriately used.

The construction of the EUV exposure apparatus constituting a working configuration of the present invention is basically the same as that of the apparatus shown in FIG. 6. The only difference is that the laser plasma EUV light source shown in the first working configuration or the discharge plasma EUV light source shown in the second working configuration is used as the EUV light source. Accordingly, a description is omitted.

Figure 5:
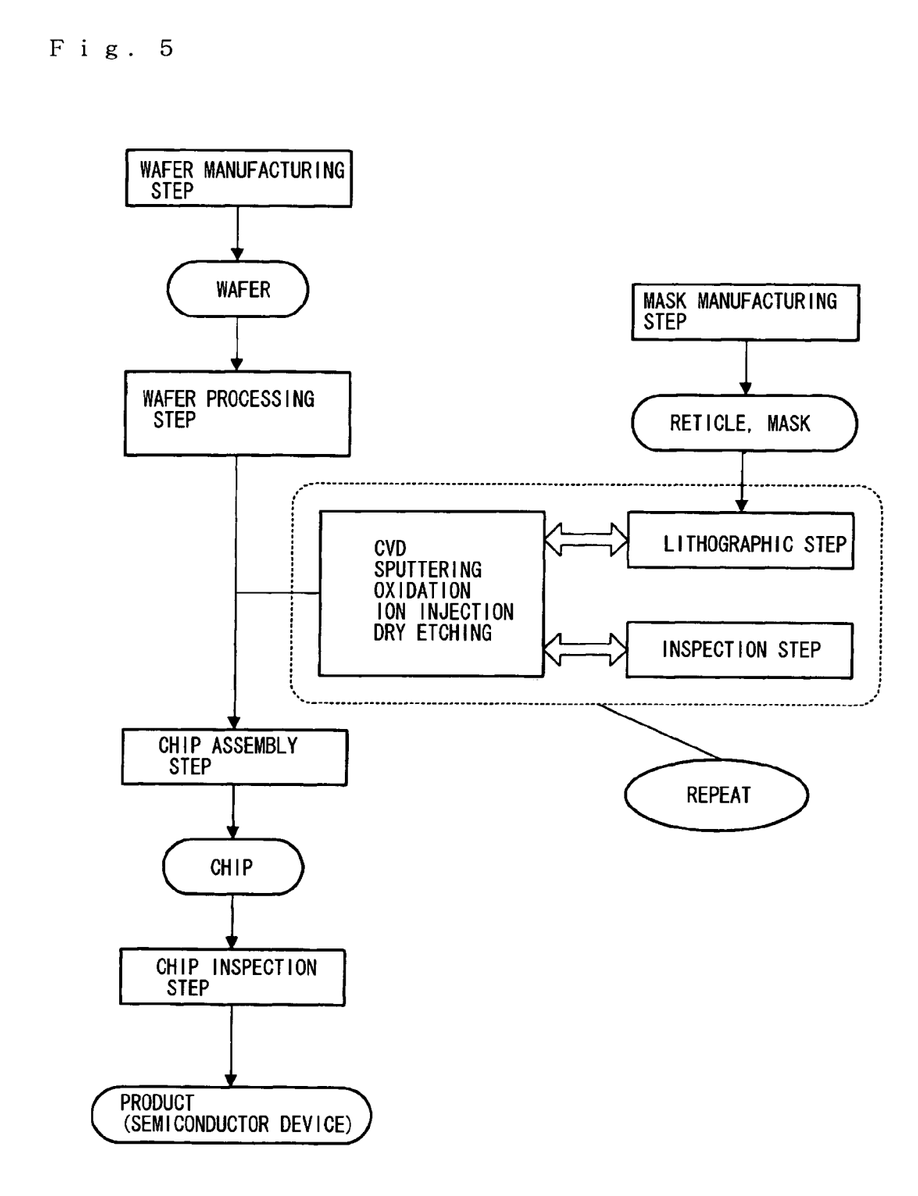
FIG. 5 is a flow chart showing one example of the semiconductor device manufacturing method of the present invention.

A working configuration of the semiconductor device manufacturing method of the present invention will be described below. FIG. 5 is a flow chart showing one example of the semiconductor device manufacturing method of the present invention. The manufacturing process of this example includes the following main steps:

(1) A wafer manufacturing step in which a wafer is manufactured (or a wafer preparation step in which a wafer is prepared);

(2) A mask manufacturing step in which the mask used in exposure is manufactured (or a mask preparation step in which such a mask is prepared);

(3) A wafer processing step in which the wafer is subjected to the necessary processing;

(4) A chip assembly step in which chips formed on the wafer are cut out one at a time, and are made operational; and (5) A chip inspection step in which the finished chips are inspected.

Furthermore, the respective steps further consist of several sub-steps.

Among these main steps, the main step that has a definitive effect on the performance of the semiconductor device is the wafer processing step. In this step, designed circuit patterns are successively laminated on the wafer, so that numerous chips that operate as memories or MPUs are formed. This wafer processing step includes the following respective steps:

(1) A thin film formation step (using CVD, sputtering, or the like) in which dielectric thin films forming insulating layers, metal thin films forming wiring parts or electrode parts, or the like, are formed;

(2) An oxidation step in which such thin film layers or the wafer substrate are oxidized;

(3) A lithographic step in which a resist pattern is formed using a mask (reticle) in order to achieve selective working of the thin film layers, wafer substrate, or the like;

(4) An etching step (e.g., using a dry etching technique) which works the thin film layers or substrate in accordance with the resist pattern;

(5) An ion/impurity injection and diffusion step;

(6) A resist stripping step; and (7) An inspection step in which the worked wafer is further inspected.

Furthermore, the wafer processing step is repeated a number of times that is equal to the required number of layers, so that semiconductor devices that operate as designed are manufactured.

In the semiconductor device manufacturing method of the present working configuration, the EUV exposure apparatus that constitutes a working configuration of the present invention is used in the lithographic step. Accordingly, the exposure of patterns that have a fine line width can be accomplished, and at the same time, exposure can be performed at a high throughput, so that semiconductor devices can be manufactured with a high efficiency.

The invention claimed is:

1. A plasma EUV light source comprising:
   a target, wherein the target comprises fine solid particles dispersed in a medium, the medium being a liquid formed by heating and melting a plastic resin;
   an agitation mechanism for agitating the medium in a container so as to prevent the fine solid particles from settling; and
   an energy source for applying energy to the target to produce plasma, wherein the plasma generates and emits EUV light.

2. The EUV light source according to claim 1, wherein the fine particles of the target contain Sn.

3. The EUV light source according to claim 1, wherein the plastic resin is a thermoplastic resin.

4. The EUV light source according to claim 1, further comprising a nozzle for jetting the liquid in which the fine particles of the target are dispersed.

5. The EUV light source according to claim 4, wherein the liquid is solidified after jetting from the nozzle.

6. The plasma EUV light source of claim 1, wherein the energy source comprises a laser light source.

7. The plasma EUV light source of claim 1, wherein the energy source comprises an electric discharge source.

8. An EUV exposure apparatus comprising:
   a plasma EUV light source comprising:
      a target comprising fine solid particles dispersed in a medium, the medium being a liquid formed by heating and melting a plastic resin,
      an agitation mechanism for agitating the medium in a container so as to prevent the fine solid particles from settling, and
      an energy source for applying energy to the target to produce plasma,
      wherein the plasma generates and emits EUV light,
   an illumination optical system, and
   a projection optical system,
   wherein a pattern formed on a mask is exposed by the EUV light using the illumination optical system and the pattern is transferred to a substrate by the projection optical system.

9. The EUV exposure apparatus of claim 8, wherein the energy source comprises a laser light source.

10. The EUV exposure apparatus of claim 8, wherein the energy source comprises an electric discharge source.

11. A semiconductor device manufacturing method comprising the steps of:
   producing EUV light from a plasma formed by applying energy to a target, wherein the target comprises fine solid particles dispersed in a medium, the medium being a liquid formed by heating and melting a plastic resin, and wherein the medium is agitated in a container by an agitation mechanism so as to prevent the fine solid particles from settling;
   exposing a pattern formed on a mask to the EUV light; and
   transferring the pattern formed on the mask to a substrate using the EUV light.

* * * * *